United States Patent [19]

Kawaguchi

[11] Patent Number: 5,400,221

[45] Date of Patent: Mar. 21, 1995

[54] PRINTED CIRCUIT BOARD MOUNTED WITH ELECTRIC ELEMENTS THEREON

[75] Inventor: Joji Kawaguchi, Tokyo, Japan

[73] Assignee: NEC Corporation, Tokyo, Japan

[21] Appl. No.: 139,084

[22] Filed: Oct. 21, 1993

[30] Foreign Application Priority Data

Oct. 21, 1992 [JP] Japan .................. 4-282638

[51] Int. Cl.⁶ .............................................. H05K 7/10
[52] U.S. Cl. ..................... 361/771; 174/257;
174/261; 174/263; 228/180.21; 228/180.22;
361/760; 361/763; 361/767; 361/768; 361/772;
361/779
[58] Field of Search ............... 174/257, 261, 263;
228/180.21, 180.22, 180.5; 361/760, 763, 767,
768, 771, 772, 773, 779; 439/83

[56] References Cited

U.S. PATENT DOCUMENTS

| | | | |
|---|---|---|---|
| 4,424,409 | 1/1984 | Küttner | 361/771 |
| 4,447,857 | 5/1984 | Marks et al. | 361/771 |
| 5,144,535 | 9/1992 | Megens et al. | 361/760 |
| 5,270,903 | 12/1993 | McMichen et al. | 361/760 |

FOREIGN PATENT DOCUMENTS 3-200343  9/1991  Japan .................. 361/771

OTHER PUBLICATIONS

Material A: "Multi-layer printed circuit board step 365" published by Kagyo-chosakai.
Material B: "Multi-chip mounting technology" published by K. K. Tricheps.

Primary Examiner—Leo P. Picard
Assistant Examiner—Donald A. Sparks
Attorney, Agent, or Firm—Young & Thompson

[57] ABSTRACT

Electric elements such as a resistance chip, a capacitor chip, a semiconductor device package, and a connector are mounted on a printed circuit board by using at least two methods selected from the re-flow method using cream solder, the chip-on board method using bonding wires, the outer lead bonding method, and the thermal pressing method using heat-seal. The printed circuit board is provided with lands having surface layers of a non-electrolysis Ni—Au plate, a soft Au plate and an electrolysis solder plate, each corresponding to a selected mounting method.

4 Claims, 15 Drawing Sheets

PRINTED CIRCUIT BOARD MOUNTED WITH ELECTRIC ELEMENTS THEREON

FIELD OF THE INVENTION

This invention relates to a printed circuit board mounted with electric elements thereon, and more particularly to, a printed circuit board mounted with electric elements thereon by at least two different mounting methods and surface treating methods.

BACKGROUND OF THE INVENTION

A conventional printed circuit board (PCB) has lands for surface-mounted devices (SMDs), wherein the lands each comprises a predetermined pattern of copper foils, and non-electrolysis Ni—Au plates covering the copper foils.

In mounting SMDs such as resistance and capacitor chips, small outline packages (SOPs), connectors, quad flat packages (QFPs), etc. on the PCB, cream solder is supplied to the lands on the PCB for a re-flow process carried out by heating the PCB, so that the SMDs are mounted on the PWD in accordance with the bonding to the patterned SMD lands. The PCB thus mounted with the SMDs is connected to an external circuit by using a flexible printed circuit (FPC) connector.

However, the conventional PCB has disadvantages in that only packaged devices can be mounted thereon due to the application of heat for the re-flow process, high density mount of the SMDs can not be realized, as requested by user due to the usage of the FPC connector, and thickness, volume and weight are totally greater than specified ones.

In consideration of the disadvantage as described above, an outer lead bonding (OLB) method using tape carrier packages, and a chip on board (COB) method using bonding wires have been adopted in place of the re-flow method using cream solder, and the FPC connector has been replaced by a thermal pressing method providing heat-seal.

In this situation, surface-treatments for PCBs adapted to the above described methods will be explained below.

(1) Non-electrolysis Ni—Au plate

All conventional SMDs can be mounted on a PCB by using SMD lands covered with the non-electrolysis Ni—Au plates. In this type of PCBs, although no problem occurs in the thermal pressing method providing heat-seal, some problems occur in the OLB method using tape carrier packages and the COB method using bonding wires. In the OLB method using the tape carrier packages, one of the problems is the occurrence of bridges among fine and narrowly spaced outer leads caused by local re-flow of cream solder supplied on the non-electrolysis Ni—Au plates covering patterned copper foils. In case where no cream solder is used, electrodes of tape automated bonding (TAB) devices are required to be plated by non-electrolysis Ni—Au layers, so that the TAB devices are directly bonded to the PCB. However, this increases the cost of fabricating device-mounted PCBs due to the adoption of the non-electrolysis Ni—Au plates on the TAB electrodes. In the COB method using bonding wires, Au bonding wires are bonded to the non-electrolysis Ni—Au plates of the SMD lands on the PCB mainly by the bonding between Ni and Au, because Au thickness of the non-electrolysis Ni—Au plates is very thin. As a result, the mechanical strength of the Ni—Au bonding portions is very low which results in low reliability.

(2) Electrolysis solder plate

The electrolysis solder plate is of an uniform surface having no roughness thereon, so that the aforementioned bridges can be avoided, even if cream solder is supplied on mounting lands to carry out the re-flow process, although it is difficult to suppress the surplus amount of solder on the PCB. The electrolysis solder plate can be used in the OLB method using tape carrier packages without any problem. In other words, although it can be used for the SMDs and the TABs, it has a problem, when it is used for the COB method using bonding wires, because the surface uniformity thereof as required in the bonding process is not obtained. Further, the bonding strength is not high and stable among terminals due to the usage of solder, thereby resulting in deterioration in quality. As a matter of course, electrodes for applying a voltage across plating portions are required to be provided. As a result, density of circuit patterns is lowered due to the provision of the electrodes.

(3) Soft Au plate

The soft Au plate is basically provided by chemical reaction. Therefore, electrodes are required to be provided for the same reason as described in the item (2). Further, Au plate treatment is required to be made even on the side of TAB in the OLB method using tape carrier packages. As a result, the increase is inevitable in cost.

As discussed in the items (1) to (3), devices or parts to be mounted on a PCB are limited in kind dependent on what kind of a plating layer is used on the PCB. Consequently, a PCB mounted with electric elements is difficult to fabricate with high density, thin and small configuration, and high quality.

SUMMARY OF THE INVENTION

Accordingly, it is an object of the invention to provide a PCB mounted with electric elements thereon in which the element mounting density becomes high, and thin and small size configuration is realized.

It is a further object of the invention to provide a PCB mounted with electric elements thereon in which reliability is increased.

According to the invention, a PCB comprises:

electric elements mounted on the PCB, the electric elements being mounted thereon by using at least two methods selected from a re-flow method using supplied cream solder, a chip-on board method using bonding wires, an outer lead bonding method for mounting a tape carrier package, and a thermal pressing method providing heat-seal.

BRIEF DESCRIPTION OF THE DRAWINGS

The invention will be explained in more detail in conjunction with appended drawings, wherein:

FIGS. 1A to 1C show a conventional PCB mounted with electric elements thereon, wherein FIG. 1A is a top surface perspective view, FIG. 1B is a bottom surface perspective view, and FIG. 1C is a cross-sectional view, FIGS. 2A to 2C, and FIGS. 3A to 3C show PCBs mounted with electric elements thereon in first and second preferred embodiments according to the invention, respectively, wherein FIGS. 2A and 3A are top surface perspective views, FIGS. 2B and 3B are bottom surface perspective views, and FIGS. 2C and 3C are cross-sectional views, and FIGS. 4A and 4B, FIGS. 5A and 5B, FIGS. 6A and 6B, FIGS. 7A and 7B, FIGS. 8A and 8B, FIGS. 9A and 9B, FIGS. 10A and 10B, FIGS. 11A and 11B, FIGS. 12A and 12B show PCBs mounted with electric elements thereon in third to eleventh preferred embodiments according to the invention, respectively, wherein FIGS. 4A to 12A are top surface-perspective views, and FIGS. 4B to 12B are bottom surface-perspective views.

DETAILED DESCRIPTION OF THE PREFERRED EMBODIMENTS

Before explaining a PCB mounted with electric elements thereon in the first preferred embodiment according to the invention, the aforementioned conventional PCB mounted with electric elements thereon will be explained.

Figure 1A:
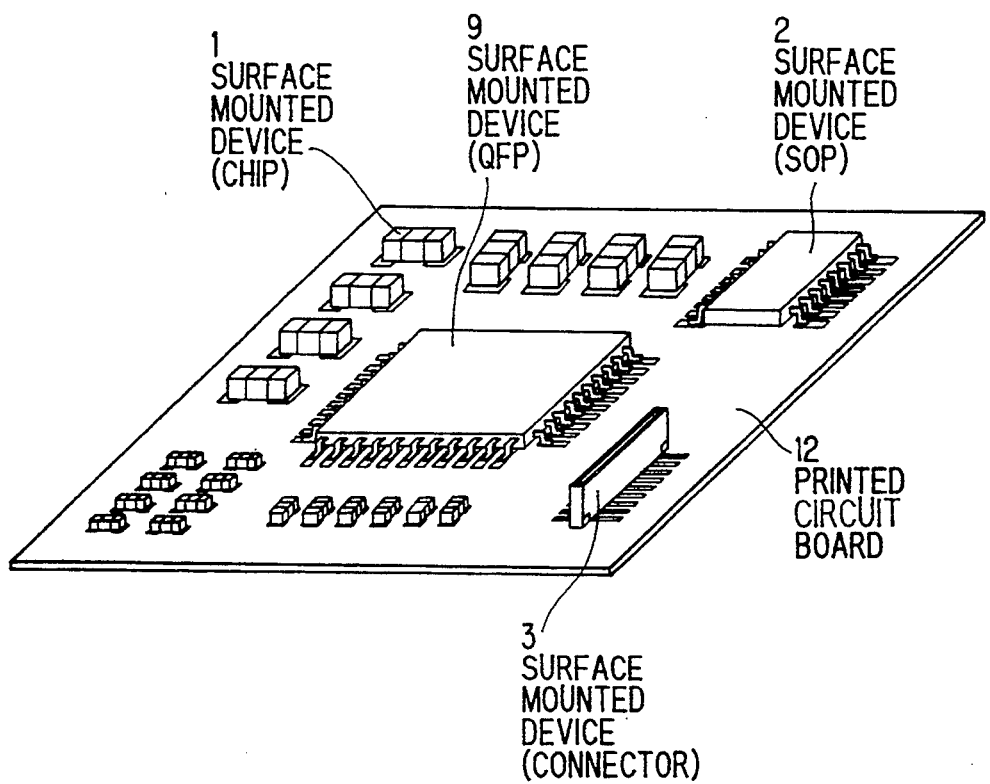

FIG. 1A shows the conventional PCB 12, on the top surface of which various SMDs including chips 1 such as resistances and capacitors which are molded by ceramic, plastic, etc., a SOP 2 which is packaged by plastic, etc., a connector 3 for connecting internal circuits on the PCB to external circuits, and a QFP 12 are provided.

Figure 1B:
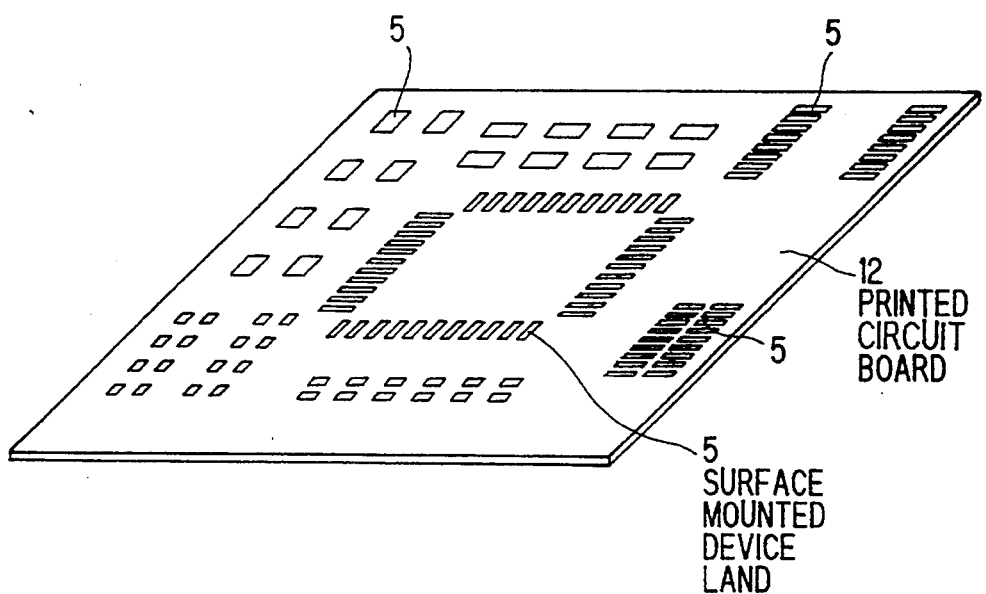
Figures 1, 1C:
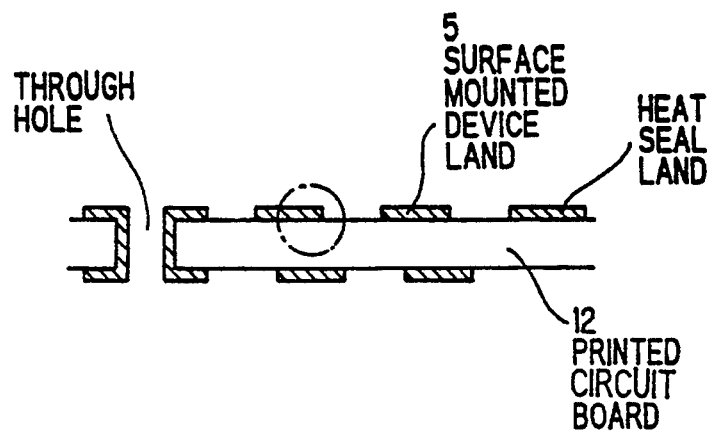
Figures 1, 1C, 2:
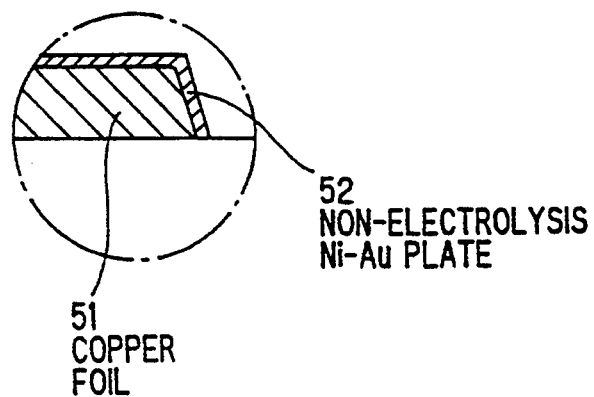

FIGS. 1B and 1C show the PCB having a through-hole (only in FIG. 1C) and SMD lands 5, wherein each of the SMD lands 5 comprises a predetermined pattern of a copper foil 51 and a non-electrolysis Ni—Au plate 52 functioning as a surface-treating layer. FIG. 1C does not correspond to FIG. 1B precisely, and only has illustrative purpose.

In fabrication, cream solder is supplied on the SMD lands 5 on the PCB 12, and the SMDs 1, 2, 3 and 9 are positioned thereon. Then, thermal treatment is carried out by heating the PCB 12 at a predetermined temperature. Thus, the re-flow process takes place to fabricate the PCB 12 mounted with electric elements thereon.

Figure 2A:
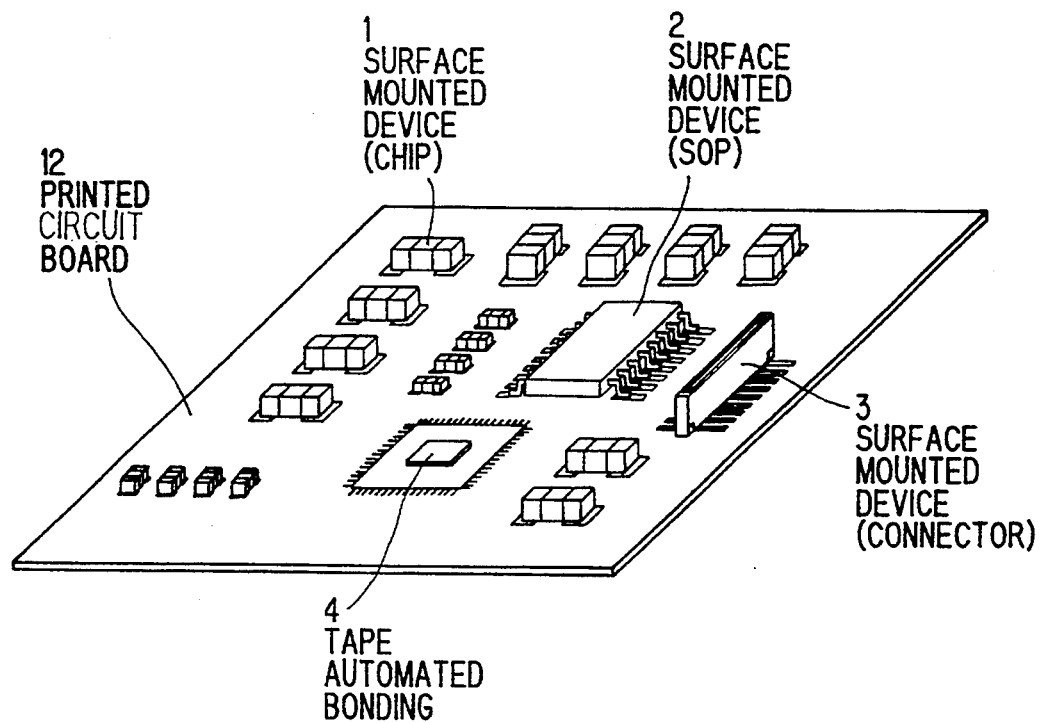

FIG. 2A shows a PCB mounted with electric elements thereon in the first preferred embodiment according to the invention, wherein like parts are indicated by like reference numerals as used in FIG. 1A.

In the first preferred embodiment, a TAB for mounting a tape carrier package 4 which is a semiconductor device other than IC and LSI is provided on the PCB 12 in addition to the aforementioned SMDs 1, 2 and 3.

Figure 2B:
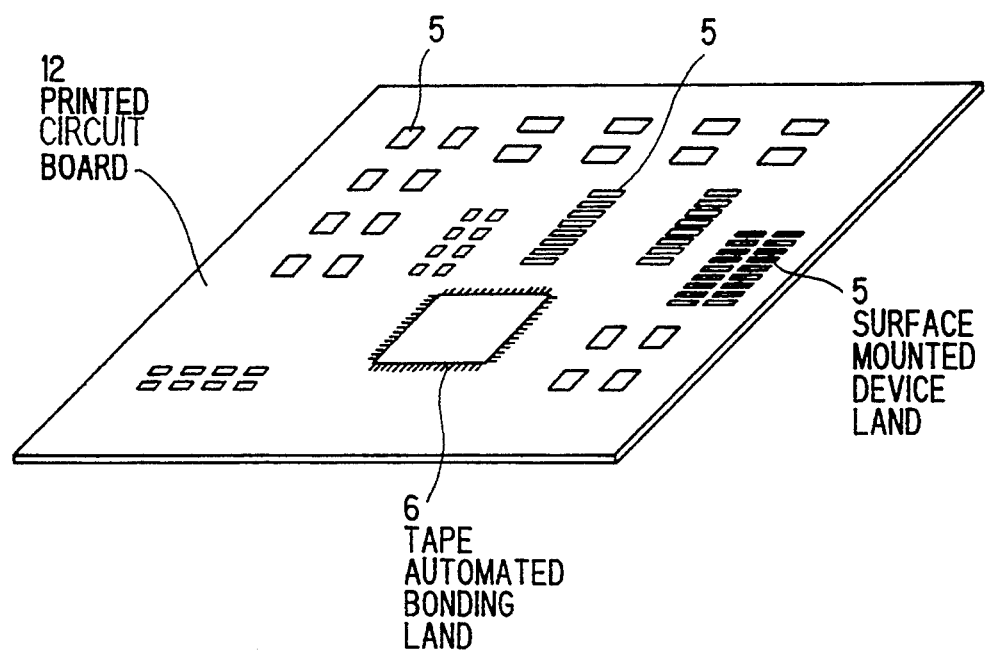
Figures 1, 2C:
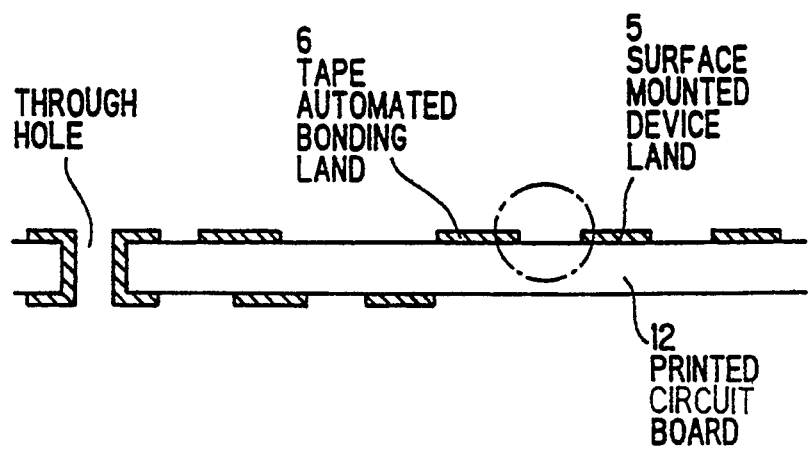
Figures 2, 2C:
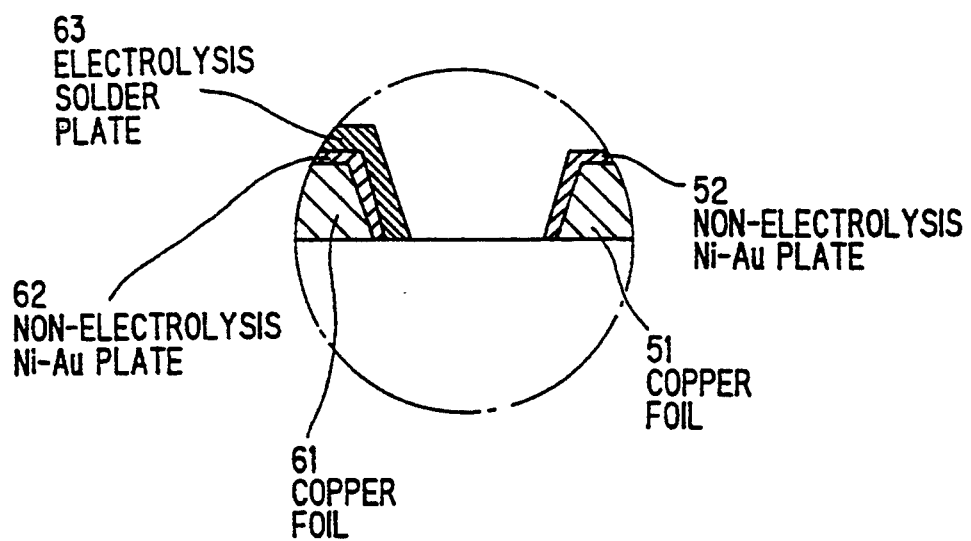

FIGS. 2B and 2C show the PCB 12 having a through-hole (only in FIG. 2C), SMD lands 5 and a TAB land 6, wherein the TAB land 6 comprises a predetermined pattern of a copper foil 61, a non-electrolysis Ni—Au plate 62, and an electrolysis solder plate 63.

In fabrication, the TAB package 4 is mounted on the TAB land 6 by the OLB method, so that the tape carrier package is mounted on the PCB 12 in accordance with local re-flow process of the electrolysis solder plate 63 using no cream solder. On the other hand, the SMDs 1, 2 and 3 are mounted in the same manner as in FIGS. 1A, 1B and 1C.

Figure 3A:
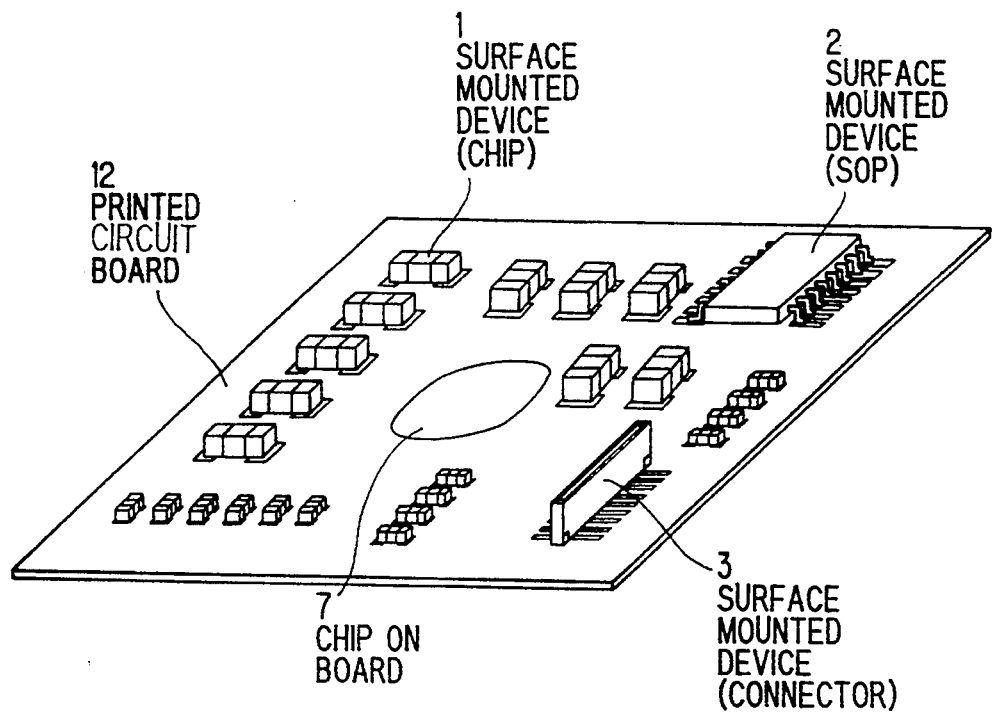

FIG. 3A shows a PCB 12 mounted with electric elements thereon in the second preferred embodiment according to the invention, wherein like parts are indicated by like reference numerals as used in FIGS. 1A and 2A.

In the second preferred embodiment, a COB device 7 (a pair of ICs) is provided on the PCB 12 in addition to the SMDs 1, 2 and 3.

Figure 3B:
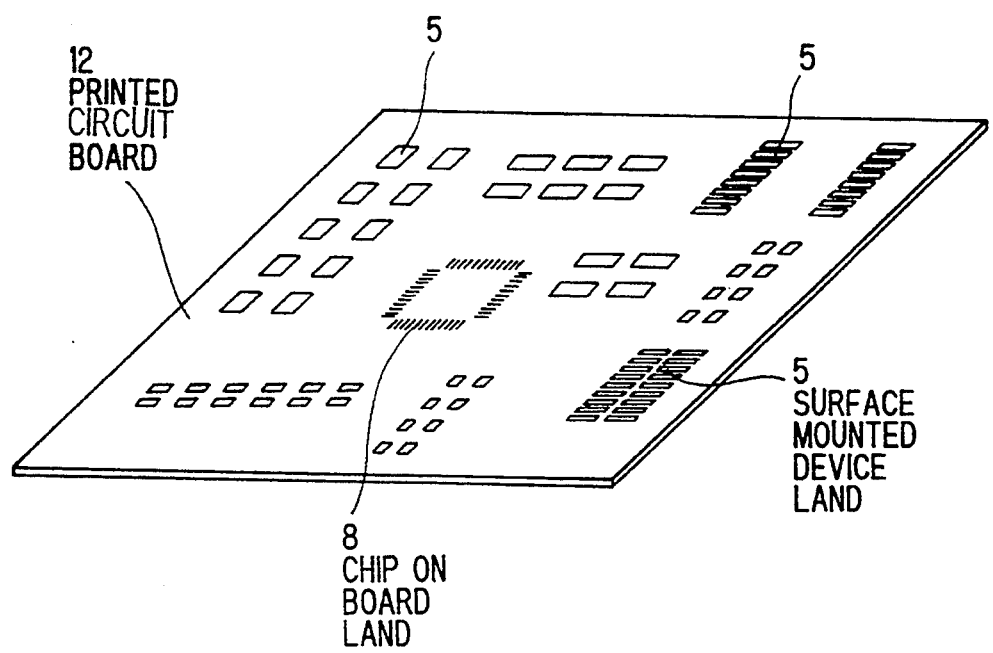
Figures 1, 3C:
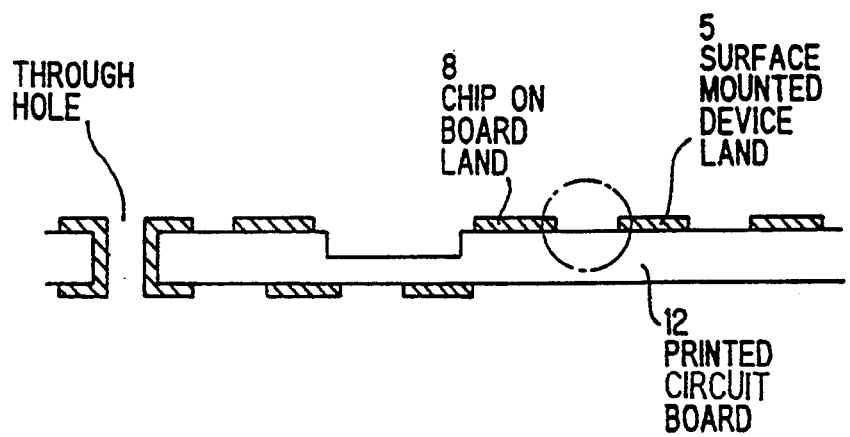
Figures 2, 3C:
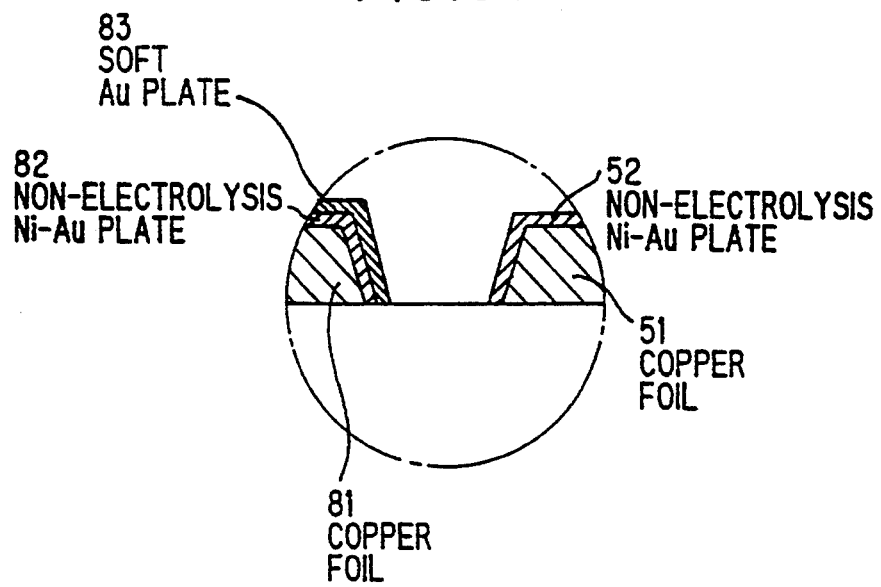

FIGS. 3B and 3C show the PCB 12 having a through-hole (only in 3C), SAD lands 5 and a COB land 8, wherein the COB land 8 comprises a predetermined pattern of a copper foil 81, a non-electrolysis Ni—Au plate 82, and a soft Au plate 83.

In fabrication, the pair of ICs are mounted on the PCB 12 by using Au bonding wires (not shown) to be bonded to the soft Au solder 83 of the COB land 8. On the other hand, the SMDs 1, 2 and 3 are mounted on the PCB 12 in the same manner as in FIGS. 1A, 1B and 1C.

Figure 4A:
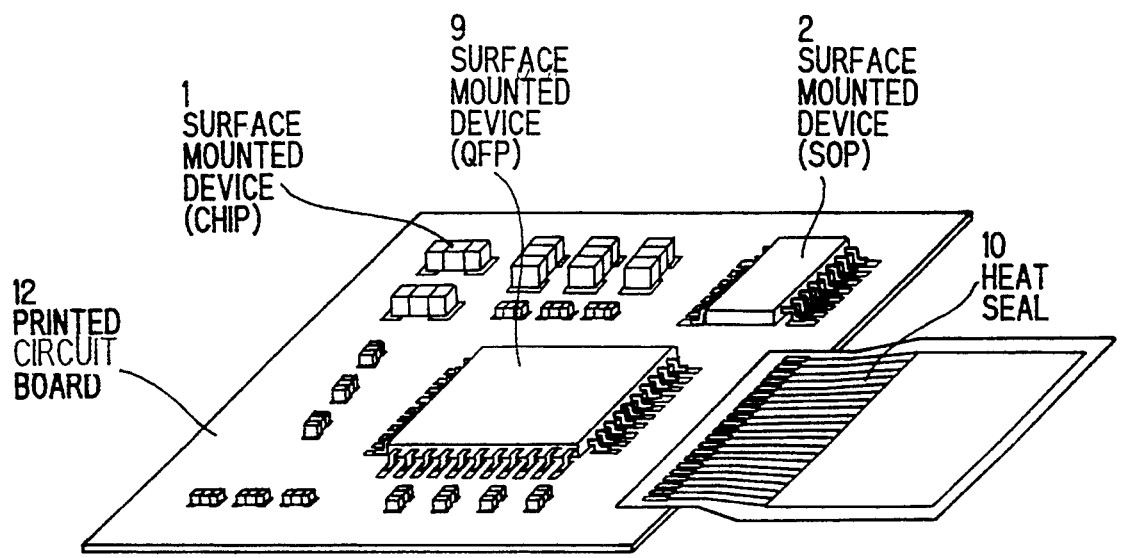

FIG. 4A shows a PCB 12 mounted with electric elements thereon in the third preferred embodiment according to the invention, wherein like parts are indicated by like reference numerals as used in FIGS. 1A, 2A and 3A.

In the third preferred embodiment, a heat-sealed connector 10 for connecting internal circuits on the PCB 12 to external circuits is provided on the PCB 12.

Figure 4B:
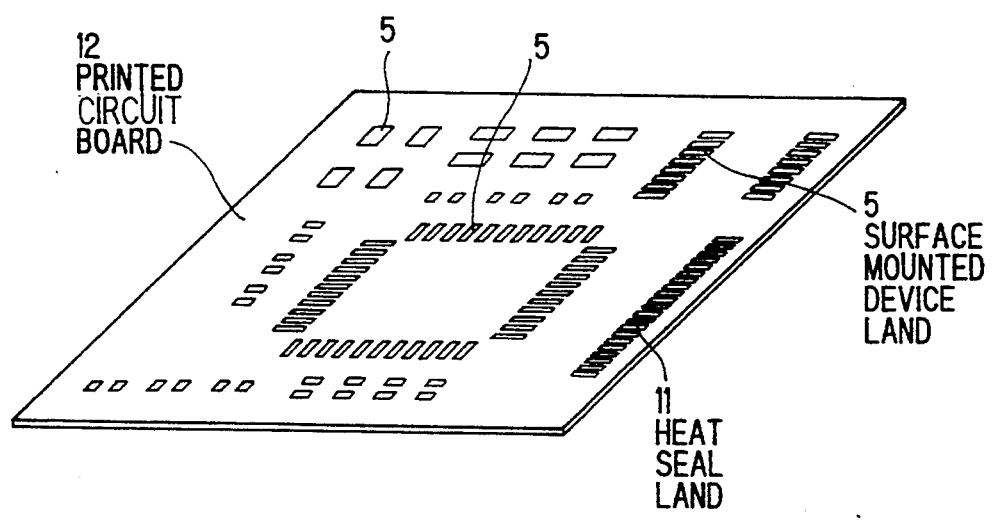

FIG. 4B shows the PCB 12 having SMD lands 5 and a heat-seal land 11, wherein the heat seal connection is realized in accordance with local re-flow of non-electrolysis Ni—Au plate, as shown in FIG. 1C, functioning as a surface-treating layer by thermal pressing method using thermal setting adhesive.

Figure 5A:
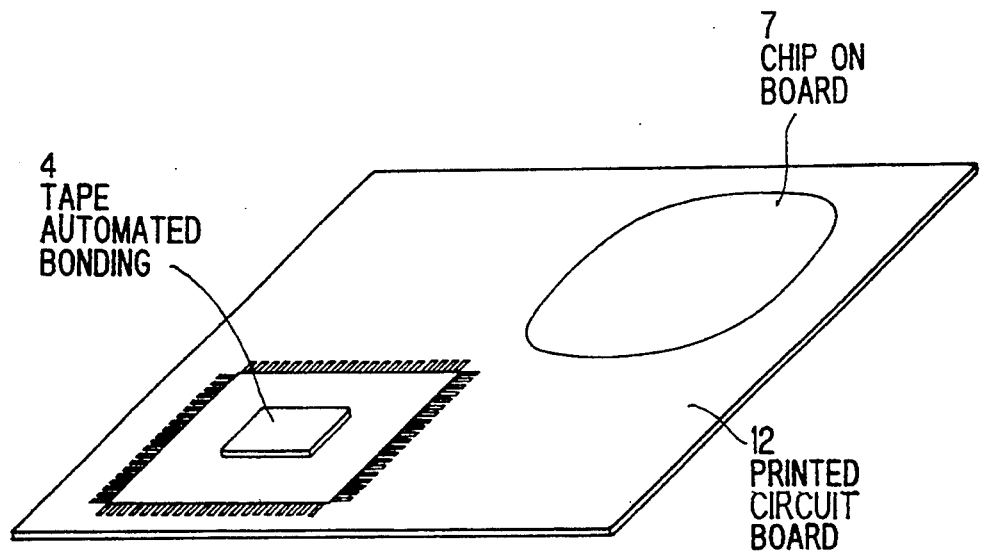

FIG. 5A shows a PCB 12 mounted with electric elements thereon in the fourth preferred embodiment according to the invention, wherein like parts are indicated by like reference numerals as used in FIGS. 1A to 4A.

Figure 5B:
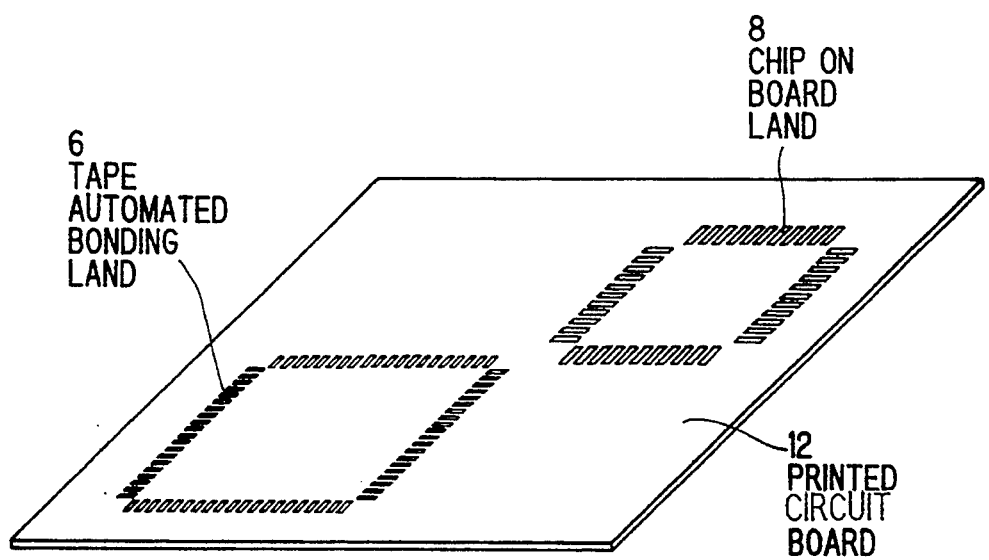

FIG. 5B shows the PCB 12 having a TAB land 6 and a COB land 8 which are explained before.

Figure 6A:
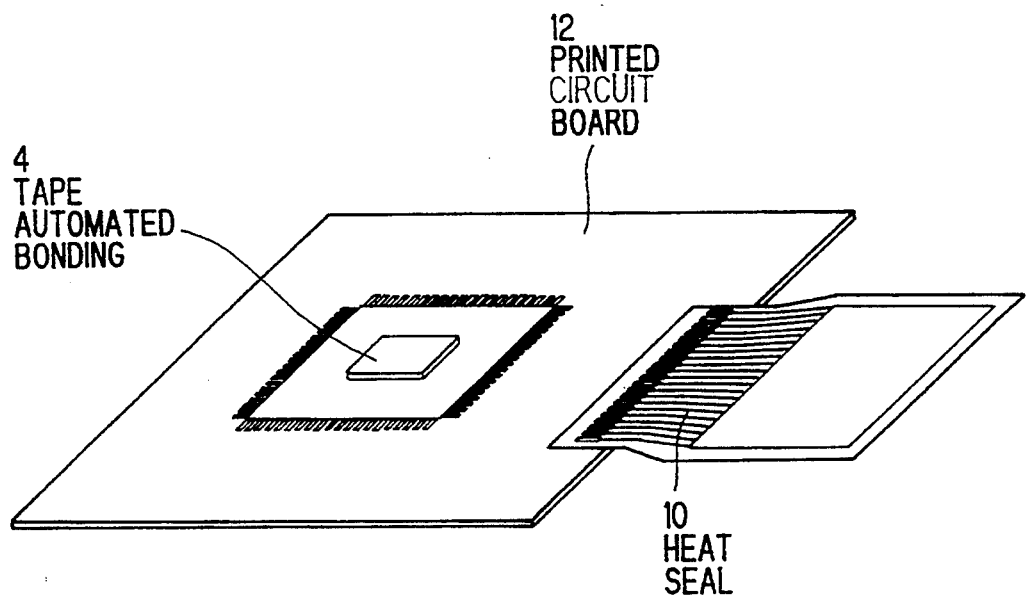

FIG. 6A shows a PCB 12 mounted with electric elements thereon in the fifth preferred embodiment according to the invention, wherein like parts are indicated by like reference numerals as used in FIGS. 1A to 5A.

Figure 6B:
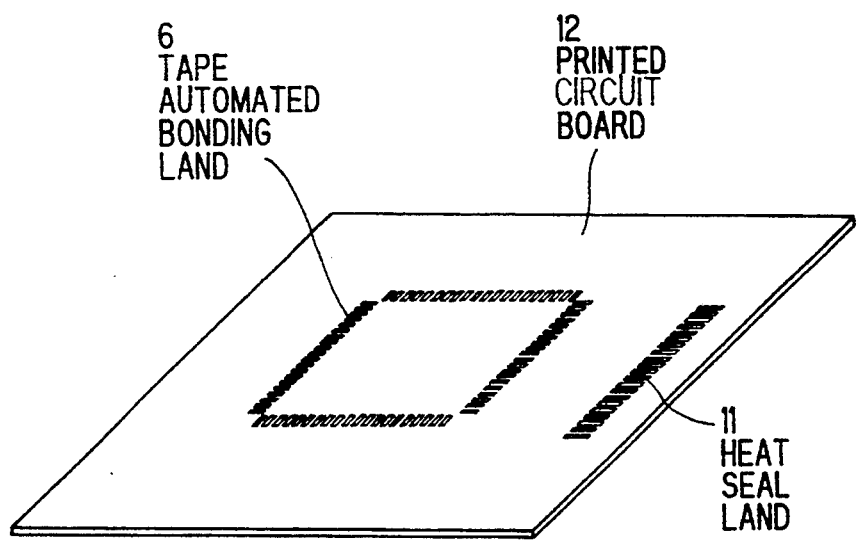

FIG. 6B shows the PCB 12 having a TAB land 6 and a heat-seal land 11 which are explained before.

Figure 7A:
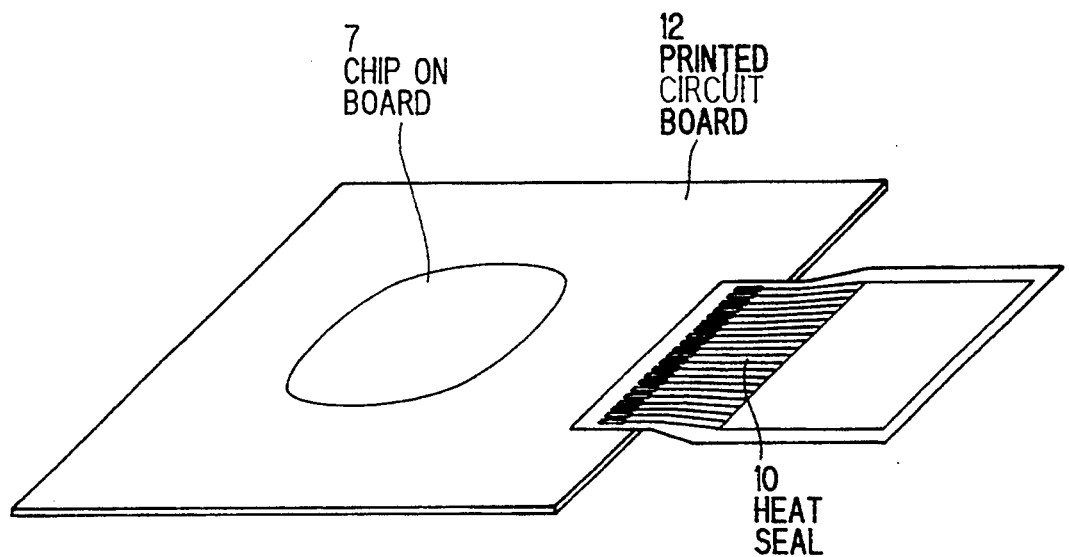

FIG. 7A shows a PCB 12 mounted with electric elements thereon in the sixth preferred embodiment according to the invention, wherein like parts are indicated by like reference numerals as used in FIGS. 1A to 6A.

Figure 7B:
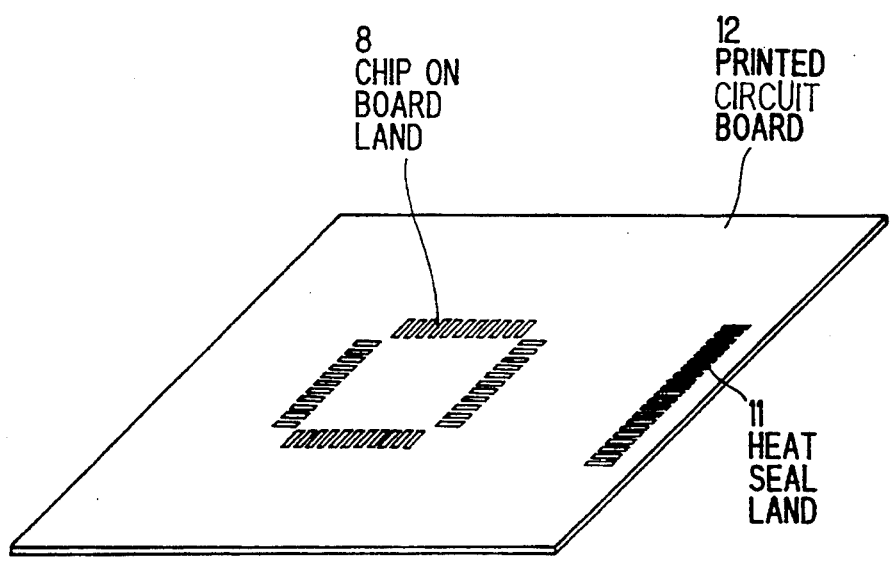

FIG. 7B shows the PCB 12 having a COB land 8 and a heat-seal land 11 which are explained before.

Figure 8A:
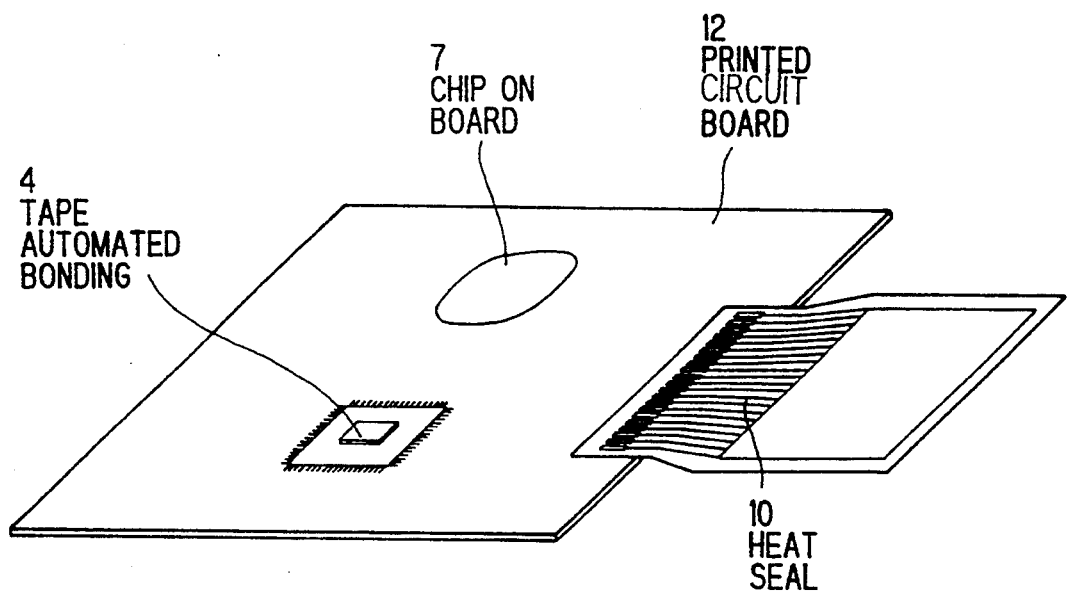
Figure 8B:
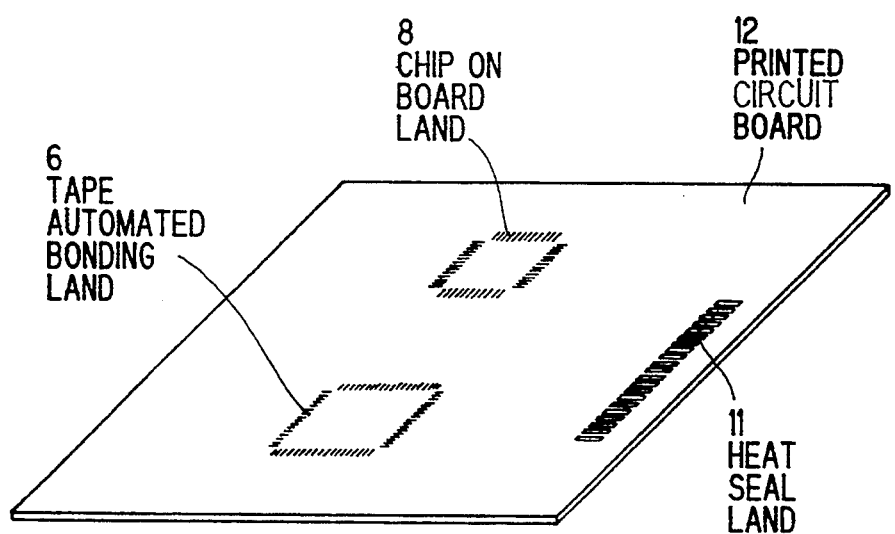

FIG. 8A and 8B show a PCB 12 in the seventh preferred embodiment according to the invention, wherein a TAB package 4, a COB-IC 7, and a heat-sealed connector 10 are mounted on the PCB 12 by the OLB method using a tape carrier package, the COB method using Au bonding wires, and the thermal pressing method providing heat-seal, as described before. The TAB land 6 has an electrolysis solder plate, the COB land 8 has a soft Ni—Au plate, and the heat seal land 11 has a non-electrolysis Ni—Au plate, respectively, as surface-treating layers.

Figure 9A:
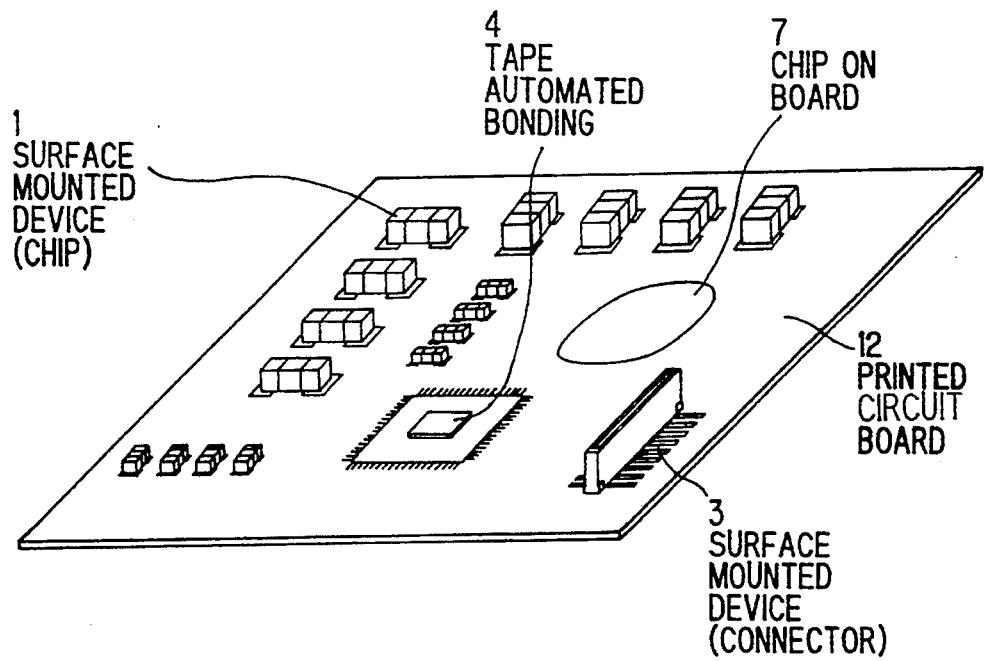
Figure 9B:
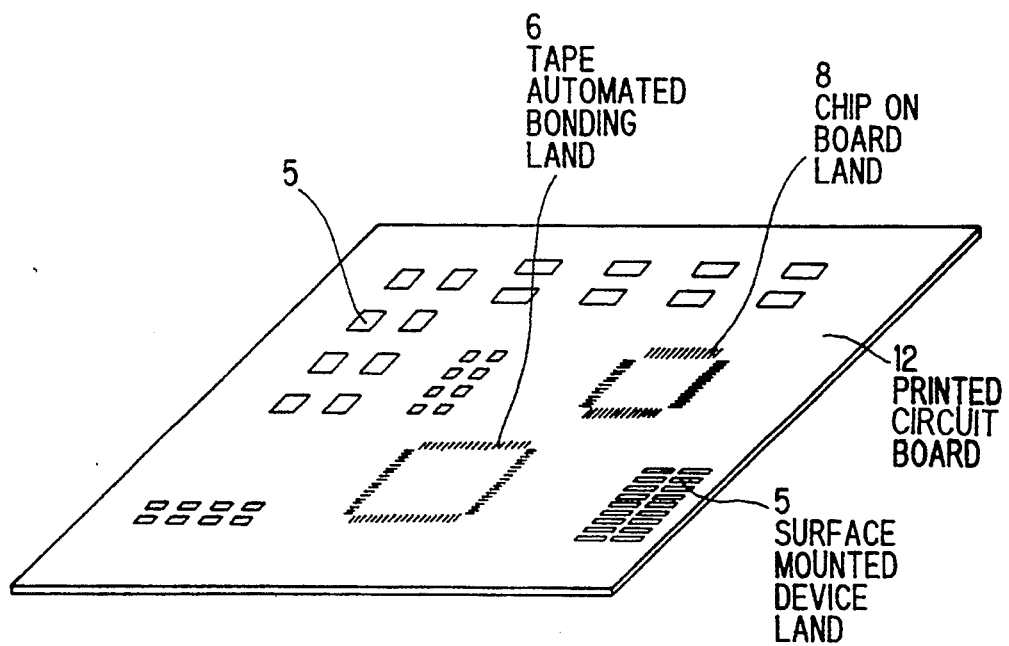

FIGS. 9A and 9B show a PCB mounted with IC thereon in the eighth preferred embodiment according to the invention, wherein resistance and capacitor chips 1 and a connector 3, a TAB package 4, and a COB-IC 7 are mounted on the PCB 12 by the re-flow method using cream solder, the OLB method for mounting a tape carrier package, and the thermal pressing method providing heat-seal, respectively. The SMD lands 5 has a non-electrolysis Ni—Au plate, the TAB land 6 has an electrolysis solder plate, and the COB land 8 has a soft Au plate, respectively, as surface-treating layers.

Figure 10A:
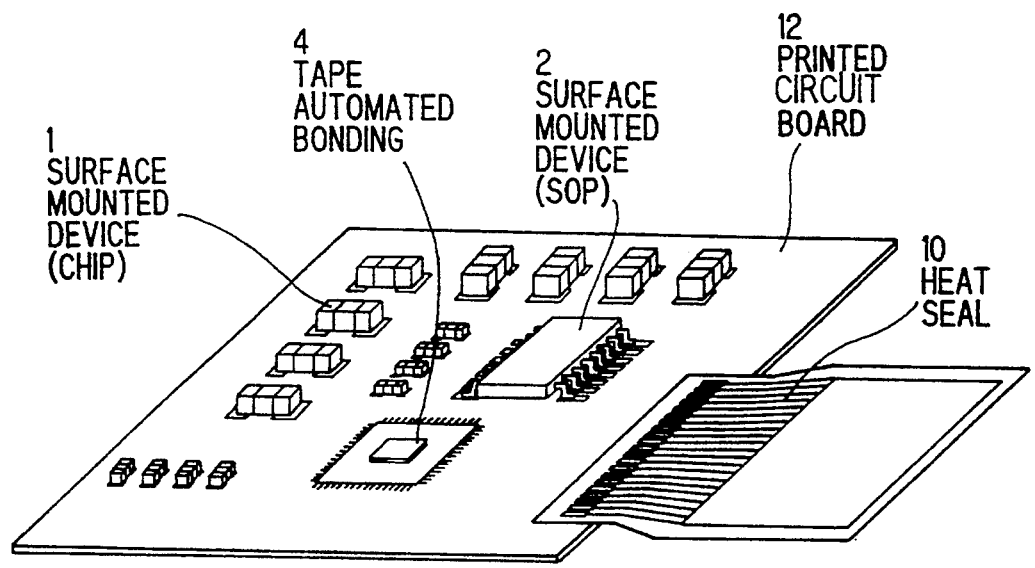
Figure 10B:
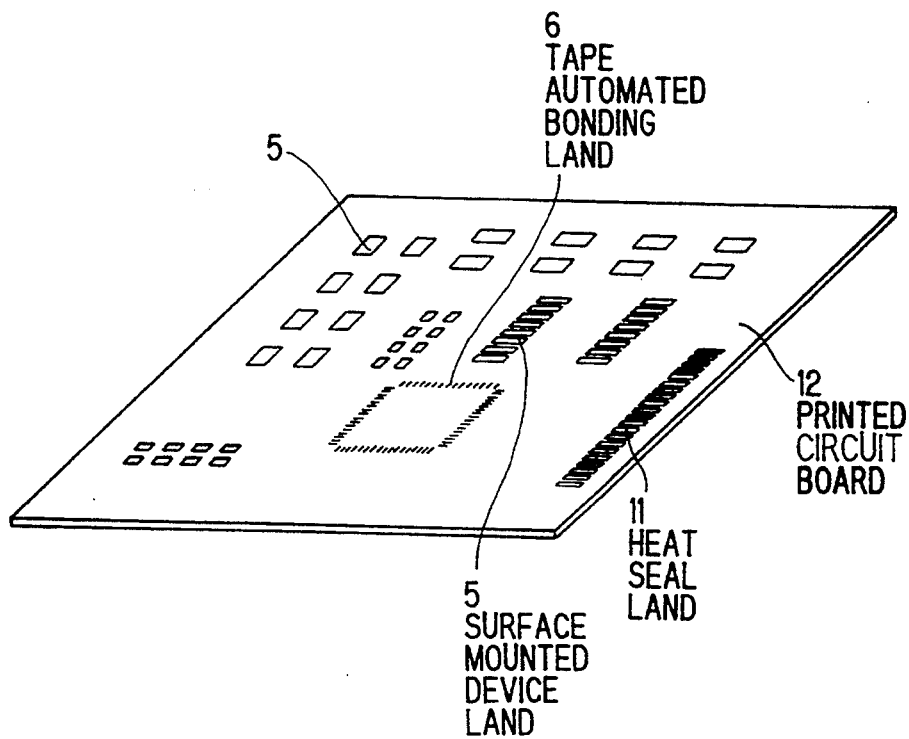

FIGS. 10A and 10B show a PCB mounted with electric elements thereon in the ninth preferred embodiment according to the invention, wherein resistance and capacitor chips 1 and a SOP 2, a TAB package 4 and a heat-sealed connector 10 are mounted on the PCB 12 by the re-flow method using cream solder, the OLB method for mounting a tap carrier package, and the thermal pressing method providing heat-seal, respectively. The SMD lands 5 and the heat-seal land 11 have non-electrolysis Ni—Au plates and the TAB land 6 has an electrolysis solder plate, respectively, as surface-treating layers.

Figure 11A:
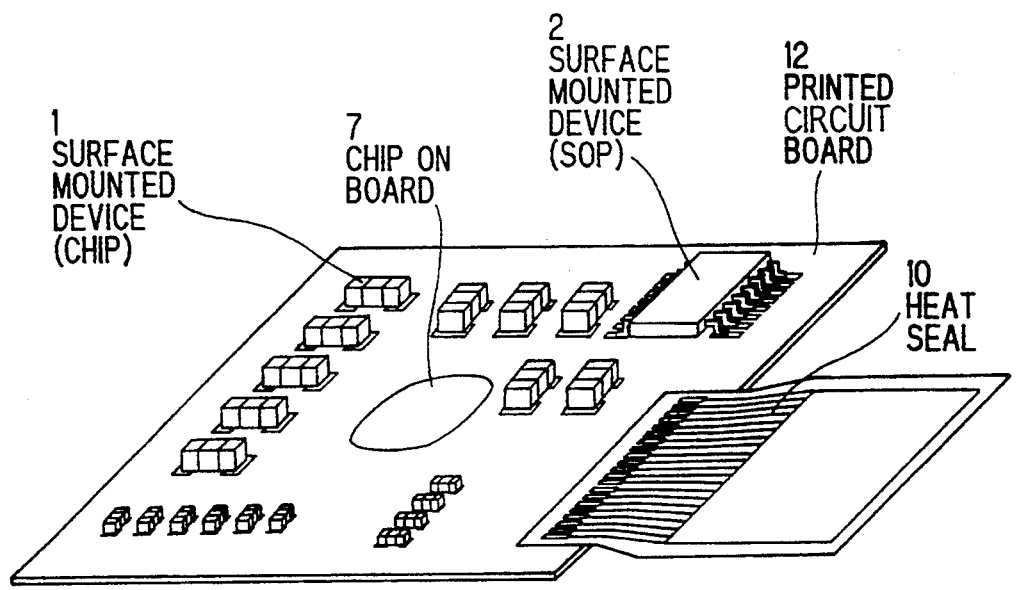
Figure 11B:
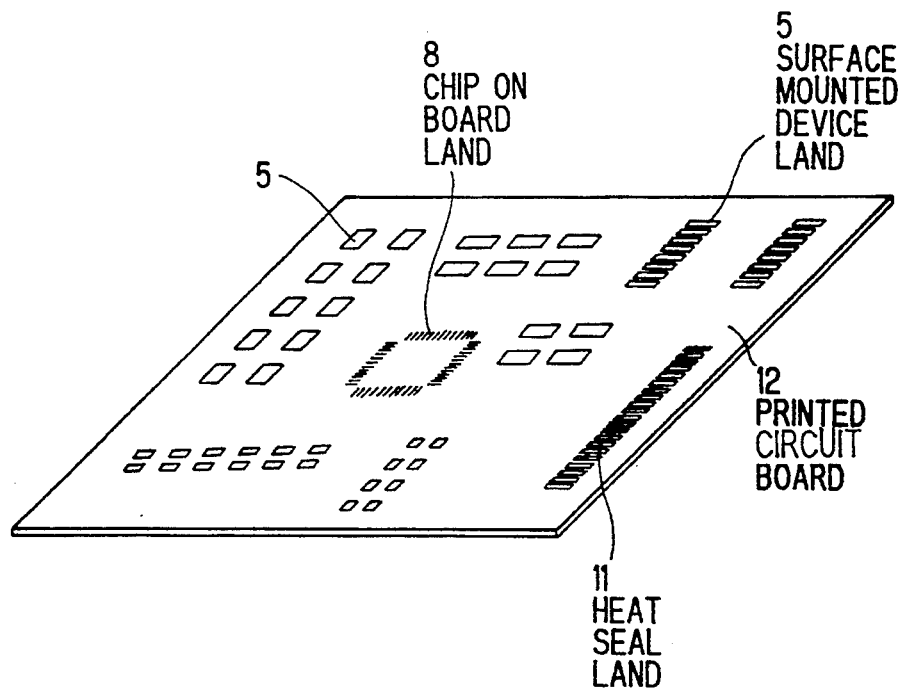

FIGS. 11A and 11B show a PCB mounted with electric elements thereon in the tenth preferred embodiment according to the invention, wherein resistance and capacitor chips 11, a SOP 2, a COB-IC 7, and a heat-sealed connector 10 are mounted on the PCB 12 by the re-flow method using cream solder, the COB method using Au bonding wires, and the thermal pressing method providing heat-seal, respectively. The SMD lands 5, and the heat-seal land 11 have non-electrolysis Ni—Au plates, and the COB land 8 has a soft Au plate, respectively, as surface-treating layers.

Figure 12A:
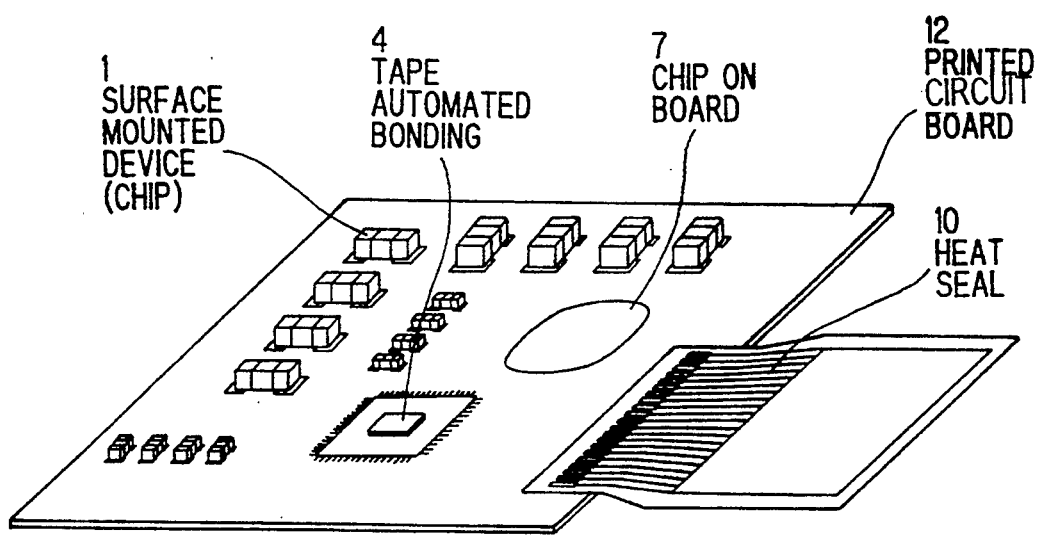
Figure 12B:
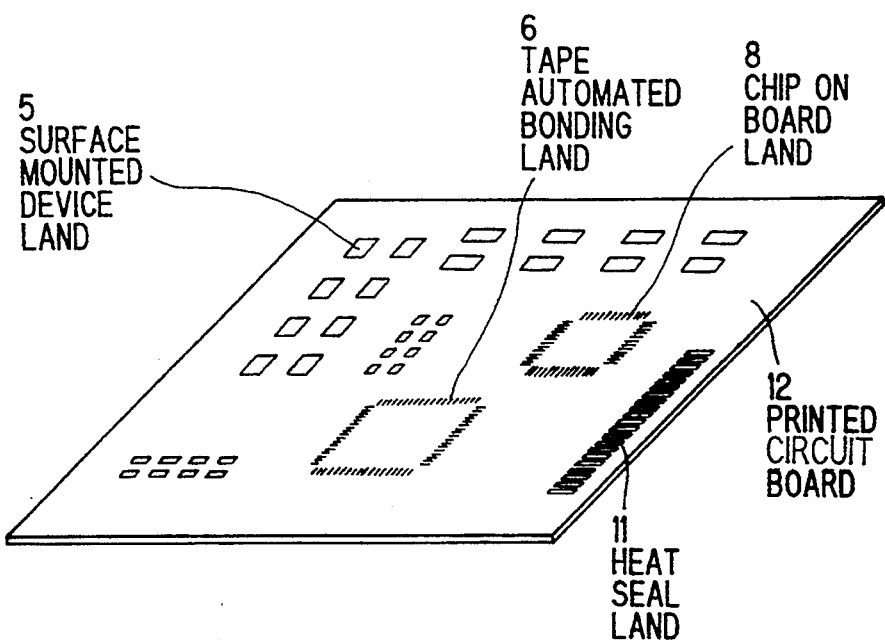

FIGS. 12A and 12B show a PCB mounted with electric elements thereon in the eleventh preferred embodiment according to the invention, wherein resistance and capacitor chips 1, a TAB package 4, a COB-IC 7, and a heat-sealed connector 10 are mounted on the PCB 12 by the re-flow method using cream solder, the OLB method for mounting a tape carrier package, the COB method using Au bonding wires, and the thermal pressing method providing heat-seal, respectively. The SMD lands 5 and the heat-seal land 11 have non-electrolysis Ni—Au plates, the TAB land 6 has an electrolysis solder plate, and the COB land 8 has a soft Au plate, respectively, as surface-treating layers.

Although the invention has been described with respect to specific embodiment for complete and clear disclosure, the appended claims are not to be thus limited but are to be construed as embodying all modification and alternative constructions that may be occur to one skilled in the art which fairly fall within the basic teaching here is set forth.

What is claimed is:

1. A printed circuit board comprising lands for mounting electric elements on said printed circuit board, said lands having a structure dependent upon which of a plurality of methods is used to mount electric elements on said printed circuit board;

said lands having a structure comprising a predetermined pattern of a copper foil covered by a non-electrolysis Ni—Au plate when a re-flow method using cream solder is used, or a thermal pressing method is used;

said lands having a structure comprising said predetermined pattern of a copper foil covered by said non-electrolysis Ni—Au plate, said non-electrolysis Ni—Au plate being in turn covered by an electrolysis solder plate when an outer lead bonding method is used to mount a tape carrier package;

said lands having a structure comprising said predetermined pattern of a copper foil covered by said non-electrolysis Ni—Au plate, said non-electrolysis Ni—Au plate being covered in turn by a soft Au plate when a chip onboard method is used to mount said electric elements on said printed circuit board.

2. A printed circuit board, according to claim 1, wherein:

said electric elements comprise at least two electric elements selected from a resistance chip, a capacitor chip, a semiconductor device package, and a connector.

3. A printed circuit board comprising:

printed electric circuits formed with a predetermined pattern on said printed circuit board; and lands provided on said printed circuit board, said lands being connected to said printed electric circuit, and comprising a land having a non-electrolysis Ni—Au plate surface layer to be used for a re-flow and thermal pressing methods to mount electric elements on said printed circuit board, a land having a soft Au plate surface layer to be used for a chip onboard method to mount electric circuit elements on said printed board, and a land having an electrolysis solder plate surface layer to be used for an outer lead bonding method to mount electric elements on said printed circuit board.

4. A method of fabricating a printed circuit board comprising lands for mounting a plurality of electric elements on said printed circuit board, said lands comprising a predetermined pattern of a copper foil covered by a non-electrolysis Ni—Au plate, said method comprising the steps of:

covering said non-electrolysis Ni—Au plate of some of said lands with an electrolysis solder plate surface layer to allow a tape carrier package to be mounted by a local re-flow method on said lands covered by said electrolysis solder plate;

covering said non-electrolysis Ni—Au plate of some of said lands with a soft Au plate surface layer to allow said electric elements to be mounted by a chip onboard method on said soft Au plate surface layer covered lands using bonding wires;

mounting some of said plurality of electric elements on some of said lands covered by said non-electrolysis Ni—Au plate surface layer by a local re-flow method using cream solder; and mounting some of said plurality of electric elements on some of said lands covered by said non-electrolysis Ni—Au plate surface layer by a thermal pressing method providing heat seal.

* * * * *